(12) United States Patent
Ujihara

(10) Patent No.: US 8,253,254 B2
(45) Date of Patent: Aug. 28, 2012

(54) SEMICONDUCTOR DEVICE AND MANUFACTURING METHOD THEREOF

(75) Inventor: Shingo Ujihara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 191 days.

(21) Appl. No.: 12/748,737

(22) Filed: Mar. 29, 2010

(65) Prior Publication Data
US 2010/0244271 A1  Sep. 30, 2010

(30) Foreign Application Priority Data

Mar. 27, 2009 (JP) ................. 2009-078001

(51) Int. Cl.
*H01L 23/52* (2006.01)
*H01L 23/48* (2006.01)
*H01L 29/40* (2006.01)
(52) U.S. Cl. ............... 257/774; 257/E23.011; 257/758; 438/667; 438/672; 438/675
(58) Field of Classification Search ........... 257/E23.011, 257/E21.585, 295, 300, 758, 773, 774; 438/3, 438/240, 672, 629, 637, 639, 640, 667, 668, 438/675, 700, 701, 713, 978
See application file for complete search history.

(56) References Cited

U.S. PATENT DOCUMENTS

| | | | |
|---|---|---|---|
| 5,633,479 A * | 5/1997 | Hirano | 174/255 |
| 6,281,541 B1 * | 8/2001 | Hu | 257/306 |
| 6,584,029 B2 * | 6/2003 | Tran et al. | 365/225.7 |
| 6,919,637 B2 * | 7/2005 | He et al. | 257/758 |
| 6,936,891 B2 * | 8/2005 | Saito et al. | 257/331 |
| 7,301,238 B2 * | 11/2007 | Smith | 257/763 |
| 7,332,813 B2 * | 2/2008 | Ueno | 257/762 |
| 2005/0087787 A1 * | 4/2005 | Ando | 257/300 |
| 2007/0176214 A1 * | 8/2007 | Kwon et al. | 257/250 |
| 2007/0241380 A1 | 10/2007 | Hasunuma | |
| 2007/0278681 A1 * | 12/2007 | Yu et al. | 257/758 |

FOREIGN PATENT DOCUMENTS

JP  2007-287794  11/2007

* cited by examiner

*Primary Examiner* — Chris Chu
(74) *Attorney, Agent, or Firm* — Young & Thompson

(57) ABSTRACT

A semiconductor device has a first insulation film defining a plurality of contact holes arranged along a predetermined direction. A plurality of first contact plugs is respectively formed in the contact holes. A second insulation film is formed on the first insulation film and defining an opening to expose a predetermined region of the first insulation film including a region where the first contact plugs are formed. A plurality of interconnections are formed to extend across the opening and to be in contact with top surfaces of the first contact plugs, respectively.

18 Claims, 11 Drawing Sheets

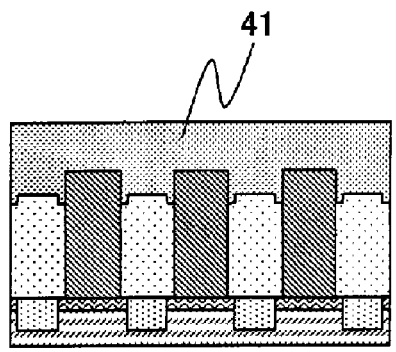 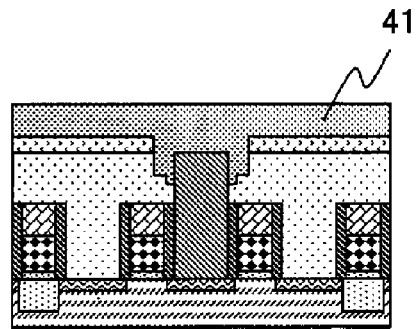
FIG. 4A  FIG. 4B
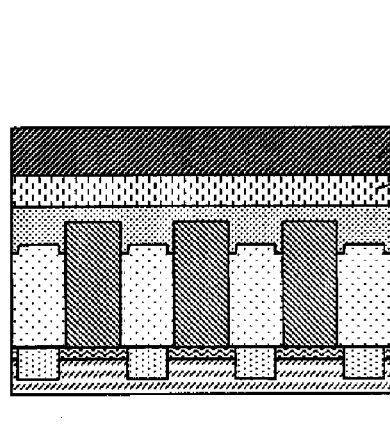 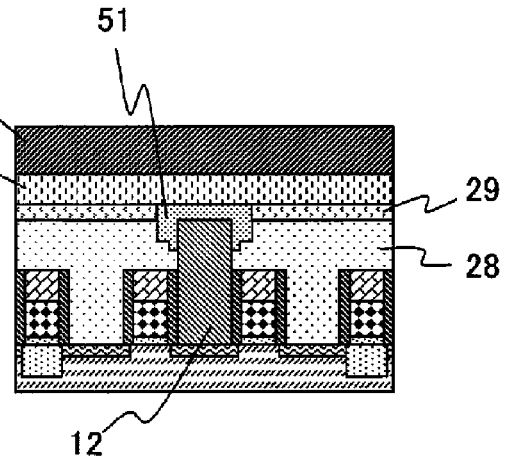
FIG. 6A  FIG. 6B
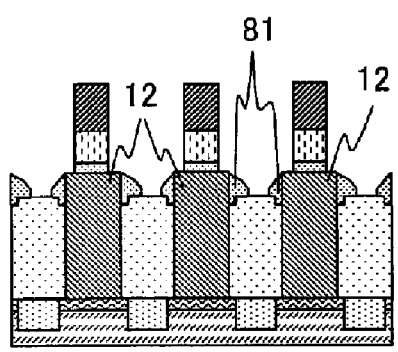 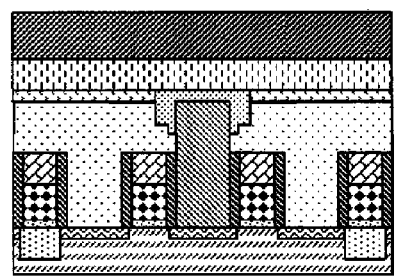
FIG. 8A  FIG. 8B

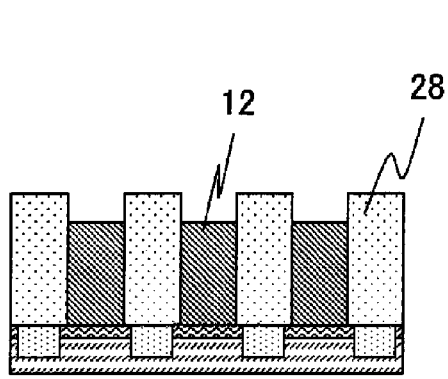
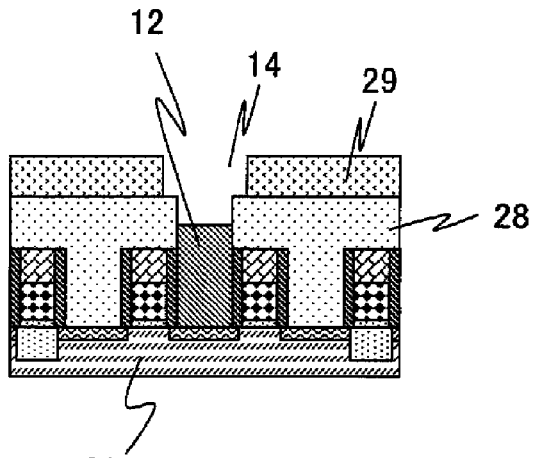
FIG. 9A  FIG. 9B
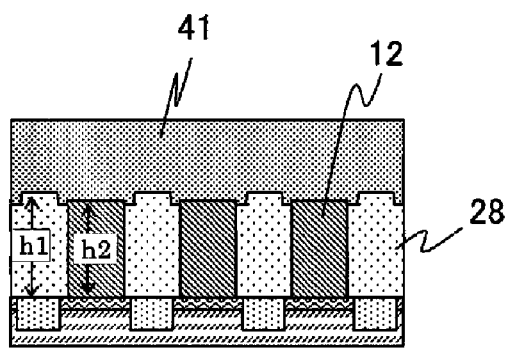
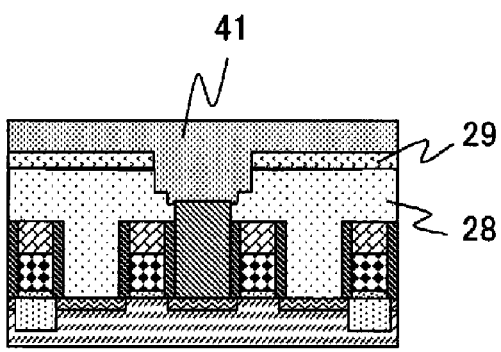
FIG. 10A  FIG. 10B
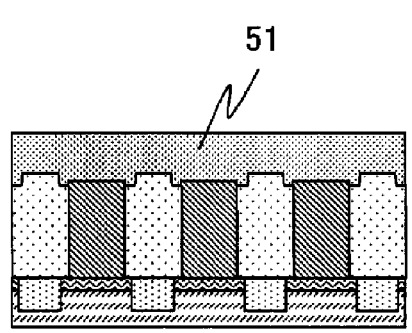
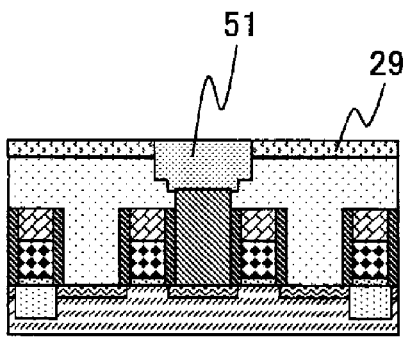
FIG. 11A  FIG. 11B

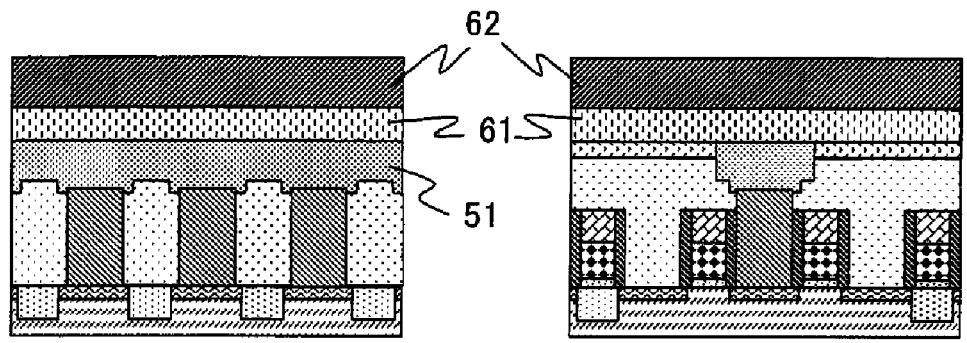
FIG. 12A    FIG. 12B
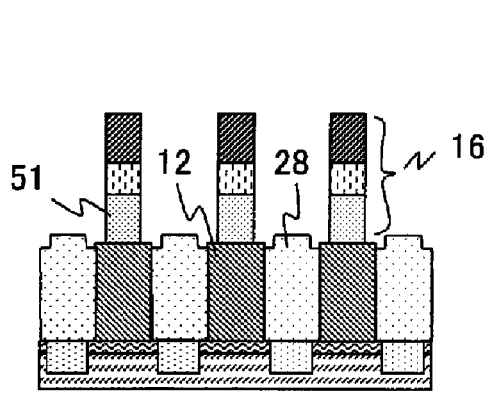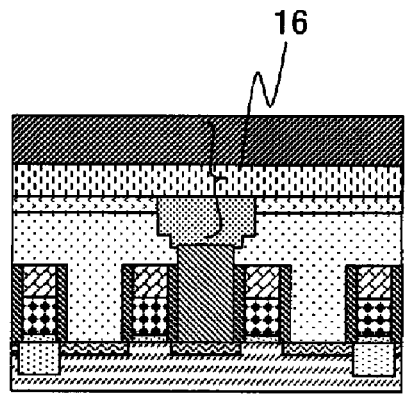
FIG. 13A    FIG. 13B
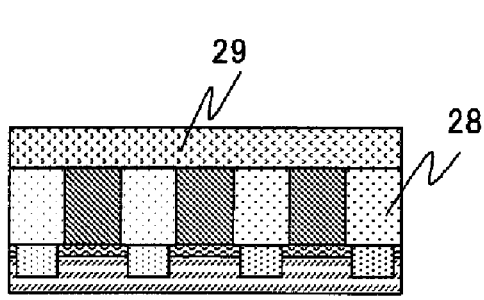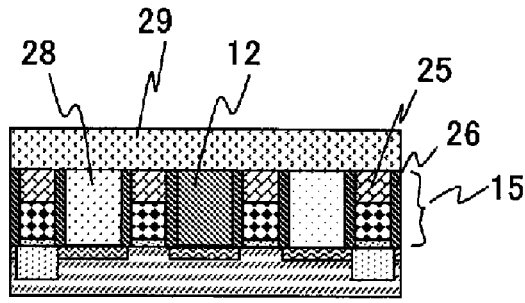
FIG. 14A    FIG. 14B

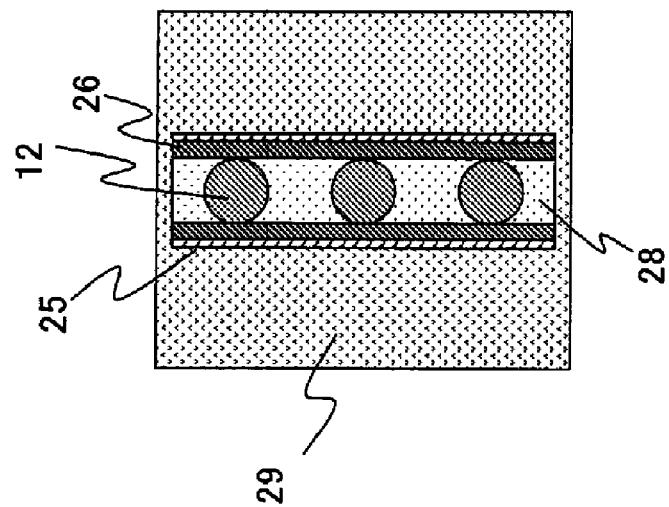
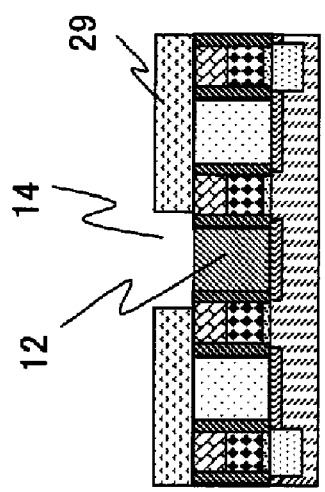
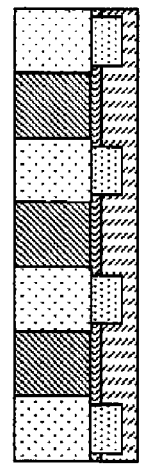
FIG. 15C
FIG. 15B
FIG. 15A

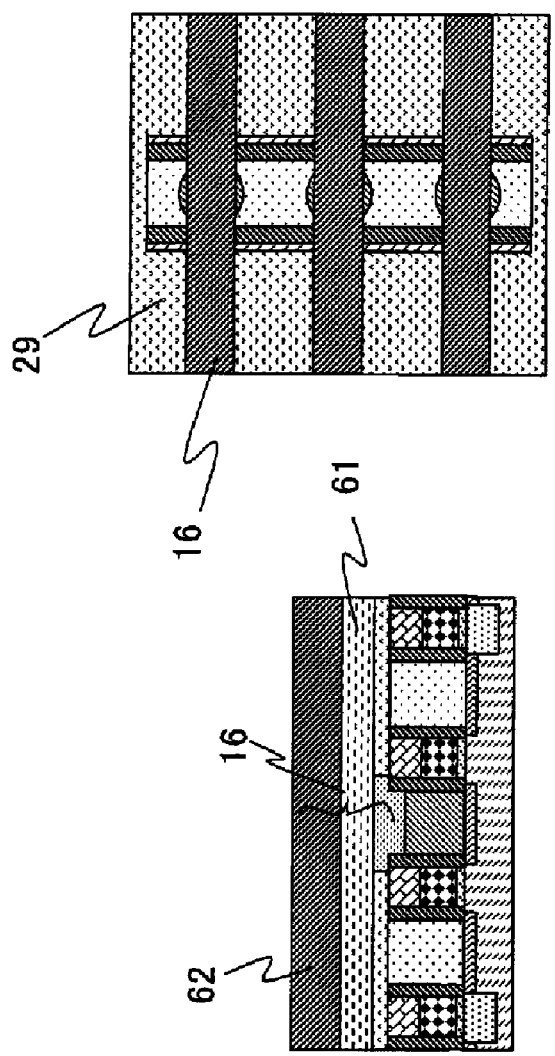
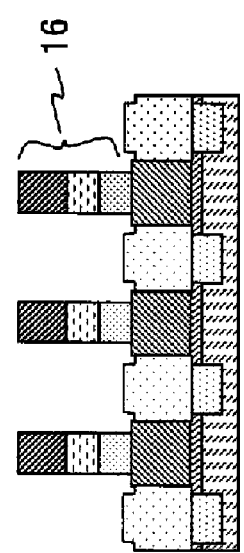
FIG. 19C
FIG. 19B
FIG. 19A

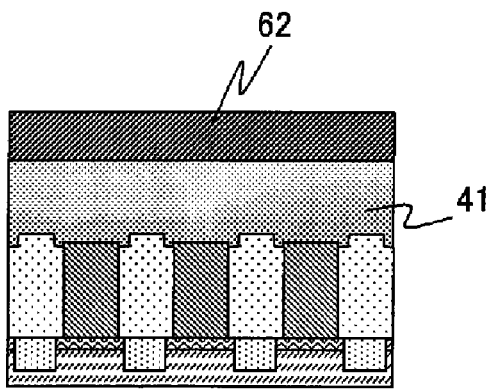
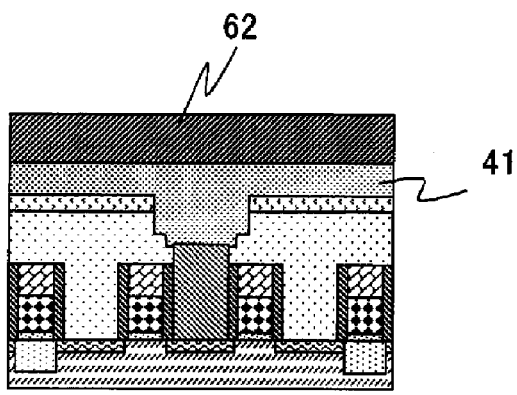
FIG. 20A          FIG. 20B
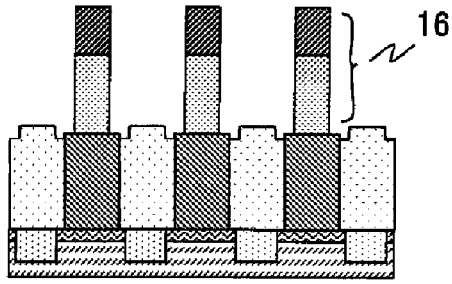
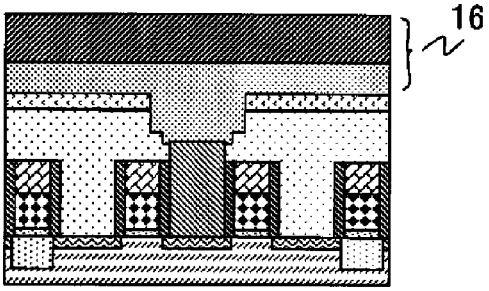
FIG. 21A          FIG. 21B
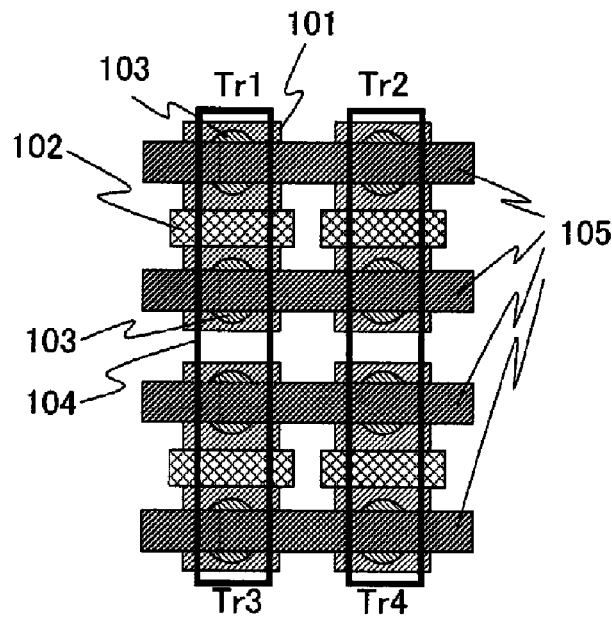
FIG. 22

US 8,253,254 B2

SEMICONDUCTOR DEVICE AND MANUFACTURING METHOD THEREOF

This application is based upon and claims the benefit of priority from Japanese patent application No. 2009-078001, filed on Mar. 27, 2009, the disclosure of which is incorporated herein in its entirety by reference.

BACKGROUND OF THE INVENTION

This invention relates to a semiconductor device and a manufacturing method thereof, and particularly relates to a semiconductor device having interconnections connected to contact plugs arranged in array and a manufacturing method of such a semiconductor device.

As high integration of MOS integrated circuits has been rapidly progressed, elements are now formed by using fine-pattern technology to its utmost limit. Under such circumstances, there are demands in fabrication of integrated circuits that holes be formed to have as small a diameter as possible and as small a hole-to-hole distance as possible according to available lithography techniques.

Element structures requiring formation of holes include those in which interconnections are connected to contact plugs the top of which are covered with an insulation film. Specifically, holes are opened in the insulation film covering the contact plugs, and electrical connection is established between the contact plugs and the interconnections formed on the insulation film, for example by filling the holes with a conductive material.

Conventionally, these holes are formed in one-to-one relationship to the contact plugs. (This type of technology is described for example in Japanese Laid-Open Patent Publication No. 2007-287794). Therefore, when a plurality of contact plugs are formed in a high density, holes corresponding to thereto must be formed in a similarly high density.

SUMMARY

However, this inventor has found that when a fine hole pattern is formed by using a lithography technique, the contrast of an optical image formed on a wafer is too low to provide a sufficient optical strength for image resolution. This is apt to lead to problems such as shallow focus depth, defective piercing, and small lithography processing margin. The inventor has also found that the occurrence of these problems is prominent particularly in regions where the hole density is low, for example, at bit-line contacts of a memory semiconductor device.

In one embodiment, there is provided a semiconductor device that includes a first interlayer film defining a plurality of contact holes arranged along a first direction. A plurality of contact plugs is filled in the contact holes, respectively. A second interlayer film is formed on the first interlayer film and has an opening to expose a predetermined region of the first interlayer film including a region where the contact plugs are disposed. A plurality of interconnections is formed to extend across the opening and to be in contact with top surfaces of the contact plugs, respectively. Each interconnection extends in a second direction which is crossed to the first direction.

In another embodiment, there is provided a manufacturing method of a semiconductor device that includes: forming a plurality of contact plugs arranged in a first direction in a first interlayer film; forming a second interlayer film on the first interlayer film and on the contact plugs; forming an opening in the second interlayer film to expose a predetermined region of the first interlayer film including a region where the contact plugs are formed; forming a interconnection conductive film on the second interlayer film to bury the opening by the interconnection conductive film; and patterning the interconnection conductive film to form a plurality of interconnections which are in contact with the contact plugs, respectively, wherein each interconnection extends in the second direction being crossed to the first direction.

According to this invention, an opening is formed in an insulation film formed on a plurality of contact plugs such that these contact plugs are exposed together in this opening. This makes it possible to make the processing margin larger in comparison with a case in which holes are formed in one-to-one relationship to contact plugs.

BRIEF DESCRIPTION OF THE DRAWINGS

The above features and advantages of the present invention will be more apparent from the following description of certain preferred embodiments taken in conjunction with the accompanying drawings, in which:

FIGS. 4A and 4B are diagrams for explaining a step of forming a second conducting film subsequent to the step shown in FIGS. 3A to 3C, FIG. 4A being a cross-sectional view taken along the line A-A' in FIG. 1, FIG. 4B being a cross-sectional view taken along the line B-B' in FIG. 1;

FIGS. 6A and 6B are diagrams for explaining a step of forming a third conducting film and a bit-line hard mask film subsequent to the step shown in FIGS. 5A to 5C, FIG. 6A being a cross-sectional view taken along the line A-A' in FIG. 1, FIG. 6B being a cross-sectional view taken along the line B-B' in FIG. 1;

FIGS. 8A and 8B are diagrams for explaining possible problems encountered when the over-etching amount is insufficient during formation of bit lines, FIG. 8A being a cross-sectional view taken along the line A-A' in FIG. 1, FIG. 8B being a cross-sectional view taken along the line B-B' in FIG. 1;

FIGS. 9A and 9B are diagrams for explaining a step of formation of a bit-line-contact forming groove and recess etching in a method of manufacturing a semiconductor device according to a second embodiment of this invention, FIG. 9A being a cross-sectional view taken along the line A-A' in FIG. 1, FIG. 9B being a cross-sectional view taken along the line B-B' in FIG. 1;

FIGS. 10A and 10B are diagrams for explaining a step of forming a second conducting film subsequent to the step shown in FIGS. 9A and 9B, FIG. 10A being a cross-sectional view taken along the line A-A' in FIG. 1, FIG. 10B being a cross-sectional view taken along the line B-B' in FIG. 1;

FIGS. 11A and 11B are diagrams for explain a step of forming bit-line contact plugs subsequent to the step shown in FIGS. 10A and 10B, FIG. 11A being a cross-sectional view taken along the line A-A' in FIG. 1, FIG. 11B being a cross-sectional view taken along the line B-B' in FIG. 1;

FIGS. 12A and 12B are diagrams for forming a step of forming a third conducting film and a bit-line hard mask film subsequent to the step shown in FIGS. 11A and 11B, FIG. 12A being a cross-sectional view taken along the line A-A' in FIG. 1, FIG. 12B being a cross-sectional view taken along the line B-B' in FIG. 1;

FIGS. 13A and 13B are diagrams for explain a step for forming bit lines subsequent to the step shown in FIGS. 12A and 12B, FIG. 13A being a cross-sectional view taken along the line A-A' in FIG. 1, FIG. 13B being a cross-sectional view taken along the line B-B' in FIG. 1;

FIG. 14A and FIG. 14B are diagrams for explain steps after formation of a first interlayer film until formation of a second interlayer film in a method of manufacturing a semiconductor device according to a third embodiment of this invention, FIG. 14A being a cross-sectional view taken along the line A-A' in FIG. 1, FIG. 14B being a cross-sectional view taken along the line B-B' in FIG. 1;

FIGS. 15A to 15C are diagrams for explain a step for forming a bit-line-contact forming groove subsequent to the step shown in FIGS. 14A and 14B, FIG. 15A being a cross-sectional view taken along the line A-A' in FIG. 1, FIG. 15B being a cross-sectional view taken along the line B-B' in FIG. 1, FIG. 15C being a plan view showing the surrounding area of the bit-line-contact forming groove shown in FIG. 1;

FIGS. 19A to 19C are diagrams for explaining a step of forming bit lines subsequent to the step shown in FIGS. 18A and 18B, FIG. 19A being a cross-sectional view taken along the line A-A' in FIG. 1, FIG. 19B being a cross-sectional view taken along the line B-B' in FIG. 1, FIG. 19C being a plan view showing the surrounding area of the bit-line-contact forming groove shown in FIG. 1;

FIGS. 20A and 20B are diagrams for explaining a step of forming a second conducting film and a bit-line hard mask film in a method of manufacturing a semiconductor device according to a fourth embodiment of this invention, FIG. 20A being a cross-sectional view taken along the line A-A' in FIG. 1, FIG. 20B being a cross-sectional view taken along the line B-B' in FIG. 1;

FIGS. 21A and 21B are diagrams for explaining a step of forming bit lines subsequent to the step shown in FIGS. 20A and 20B, FIG. 21A being a cross-sectional view taken along the line A-A' in FIG. 1, FIG. 21B being a cross-sectional view taken along the line B-B' in FIG. 1; and FIG. 22 is a plan view for explaining a configuration of a semiconductor device according to a fifth embodiment of this invention.

DESCRIPTION OF THE EXEMPLARY EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
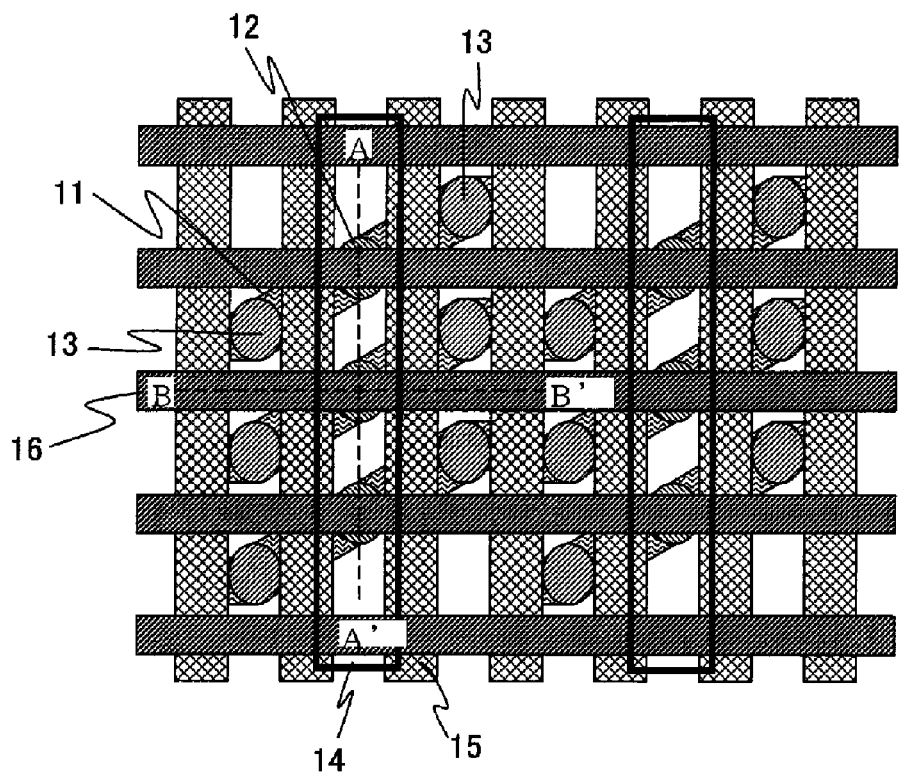
FIG. 1 is a plan view for explaining a configuration of a semiconductor device according to a first embodiment of this invention.

FIG. 1 is a plan view for explaining a partial configuration of a semiconductor device (memory device) according to a first embodiment of the invention. FIG. 1 shows a state of the memory device in which formation of bit lines serving as interconnections has been finished.

The shown memory device has an active region layer, a memory cell plug layer, a bit-line-contact forming groove layer, a word line layer, and a bit line layer. These layers are represented in FIG. 1 as active regions 11, sets of memory cell plugs each consisting of a first memory cell plug 12 and a pair of second memory cell plugs 13, bit-line-contact forming grooves 14, word lines 15, and bit lines 16.

The active regions 11 are arranged to make a predetermined angle to the bit lines 16. A pair of transistors are formed in each of the active regions 11 such that one of the source/drain regions is shared. This means that there are formed, in each of the active regions 11, two transistors having three source/drain regions.

Each of the first memory cell plugs 12 is formed on the source/drain region located at the center of the three source/drain regions in each of the active regions 11, and is connected to the corresponding bit line 16. A pair of second memory cell plugs 13 are formed on the source/drain regions located at the opposite ends of each of the active region 11, and connected to electrodes not shown. When the memory device is a DRAM device, the electrodes to which the second memory cell plugs 13 are connected are capacitor electrodes.

Each of the bit-line-contact forming grooves 14 is an opening formed in a second interlayer film to be described later, and is formed to cover a plurality of first memory cell plugs 12 arranged along a direction in which the word lines 15 are extended. In FIG. 1, each set of first memory cells is composed of three first memory cells, and an opening is formed to cover each set of the first memory cells.

The word lines 15 are formed to extend in a vertical direction as viewed in the drawing, while the bit lines 16 are formed to extend orthogonally to the word lines and in a transverse direction as viewed in the drawing. Each of the bit lines 16 is connected in common to a plurality of first memory cell plugs 12 adjacent to each other with respect to the direction the bit line 16 is extended and belong to different sets of memory cell plugs.

Figure 5C:
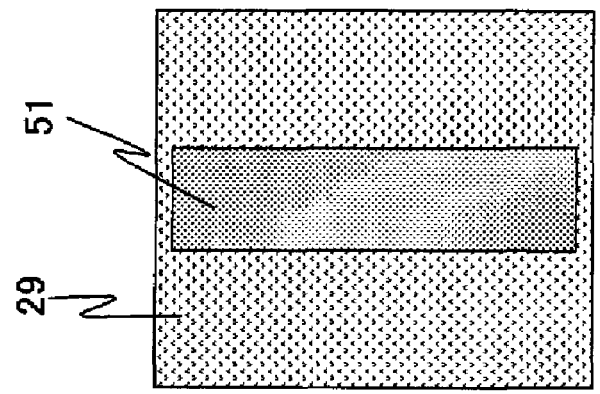
FIGS. 5A to 5C are diagrams for explaining a step of forming a bit-line contact plug subsequent to the step shown in FIGS. 4A and 4B, FIG. 5A being a cross-sectional view taken along the line A-A' in FIG. 1, FIG. 5B being a cross-sectional view taken along the line B-B' in FIG. 1, FIG. 5C being a plan view showing the surrounding area of the bit-line-contact forming groove shown in FIG. 1.
Figure 7C:
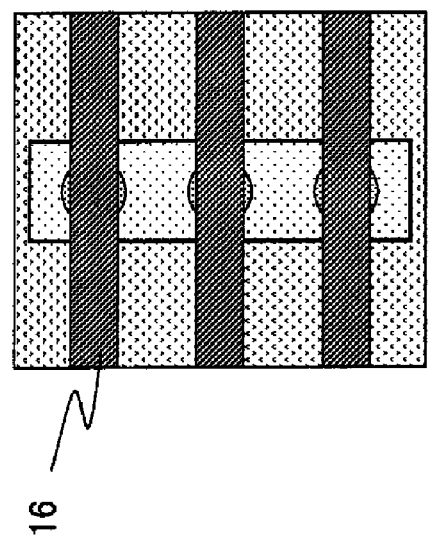
FIGS. 7A to 7C are diagrams for explaining a step of forming bit lines subsequent to the step shown in FIGS. 6A and 6B, FIG. 7A being a cross-sectional view taken along the line A-A' in FIG. 1, FIG. 7B being a cross-sectional view taken along the line B-B' in FIG. 1, FIG. 7C being a plan view showing the surrounding area of the bit-line-contact forming groove shown in FIG. 1.

A method of manufacturing the semiconductor device shown in FIG. 1 will be described with reference to FIGS. 2A and 2B through FIGS. 7A to 7C. FIGS. 2A to 7A are cross-sectional views taken along the line A-A' in FIG. 1, while FIGS. 2B to 7B are cross-sectional views taken along the line B-B' in FIG. 1. FIGS. 3C, 5C and 7C are plan views showing the surrounding area of the bit-line-contact forming groove 14.

Figures 2A, 2B:
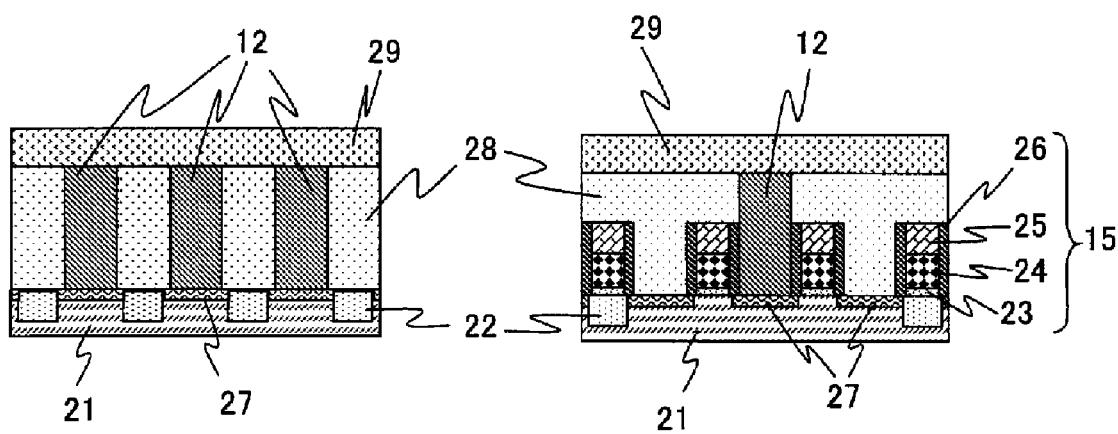
FIGS. 2A and 2B are diagrams for explaining steps until formation of a second interlayer film in a method of manufacturing the semiconductor device of FIG. 1, FIG. 2A being a cross-sectional view taken along the line A-A' in FIG. 1, FIG. 2B being a cross-sectional view taken along the line B-B' in FIG. 1.
Figure 3C:
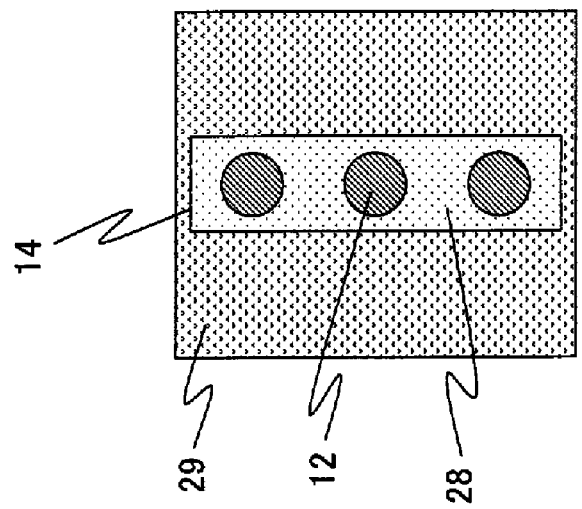
FIGS. 3A to 3C are diagrams for explaining a step of forming a bit-line-contact forming groove subsequent to the steps shown in FIGS. 2A and 2B, FIG. 3A being a cross-sectional view taken along the line A-A' in FIG. 1, FIG. 3B being a cross-sectional view taken along the line B-B' in FIG. 1, FIG. 3C being a plan view showing the surrounding area of the bit-line-contact forming groove shown in FIG. 1.

Firstly, as shown in FIGS. 2A and 2B, there are formed, on a p-type substrate (semiconductor substrate) 21, element isolation regions 22, word lines 15 each composed of a gate insulation film 23, a gate conducting film 24, a mask nitride film 25 and a spacer nitride film 26, and n-type source/drain regions 27 forming transistors.

Next, a first interlayer film 28 is formed as a first insulation film. The first interlayer film 28 may be, for example, a silicon oxide film, a BPSG (Boron-doped Phospho-Silicate Glass) film, or SOG (Spin On Glass) film.

Subsequently, memory cell contact holes are opened in the first interlayer film 28 as contact holes to reach the source/drain regions 27 on the substrate 21. Then, the memory cell plugs 12 (and 13) formed from the first conducting film are formed in the memory cell contact holes as first contact plugs. A phosphorus-doped silicon film, for example, may be used as the first conducting film. Alternatively, the first conducting film may be formed by growing a Ti film and a TiN film as barrier metal films and then growing a W film.

The memory cell plugs 12 (and 13) are formed by forming the first conducting film to fill the memory contact holes, and then removing the first conducting film located on the first interlayer film 28 by a CMP method or the like. Alternatively, the memory cell plugs 12 (and 13) may be formed by etching back the first conducting film using an etching technique. The top surfaces of the memory cell plugs 12 (and 13) are formed to be substantially flush with the top surface of the first interlayer film 28 as viewed perpendicularly to the principal surface of the substrate 21 (in a vertical direction in FIG. 2).

Then, a second interlayer film 29 is formed as a second insulation film on the first interlayer film 28 and the memory cell plugs 12 (and 13). The second interlayer film 29 may be formed, for example, by a silicon oxide film, a BPSG film, or a SOG film.

Figure 3B:
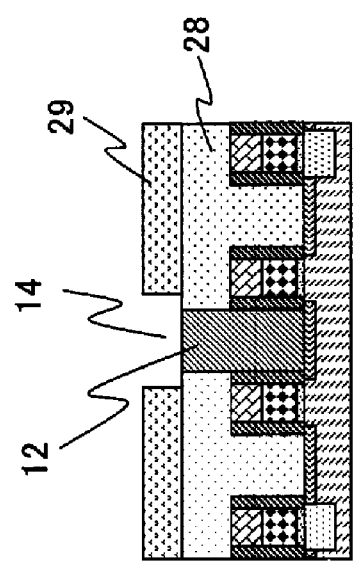
Figure 3A:
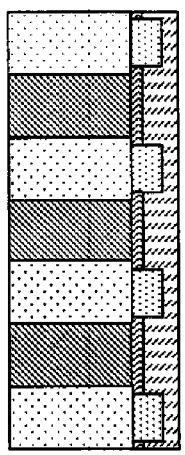

Next, as shown in FIGS. 3A, 3B and 3C, the bit-line-contact forming groove 14 is formed as an opening in the second interlayer film 29. The bit-line-contact forming groove 14 is formed to expose the surface of a plurality of (three, in this example) first memory cell plugs 12 and the surface of the first interlayer film 28 surrounding these first memory cell plugs. In other words, the bit-line-contact forming groove 14 is formed so as to expose a predetermined region including a region of the first interlayer film 28 where the first memory cell plugs 12 are formed. This means that this predetermined region covers a plurality of first memory cell plugs 12 arranged adjacent to each other along a direction in which the word lines 15 are extended.

Formation of the bit-line-contact forming groove 14 can be performed by forming a resist pattern of the bit-line-contact forming groove 14 on the second interlayer film 29 using a lithography technique, and then etching the second interlayer film 29 using the formed resist pattern as a mask. The resist pattern is then removed.

Next, a pretreatment is carried out to clean the surface of the exposed first memory cell plugs 12 to prepare for formation of bit-line contact plugs connected to the exposed first memory cell plugs 12. This pretreatment is generally performed by etching. However, as the semiconductor devices are miniaturized, the sizes of holes and grooves to be treated are also miniaturized, making it difficult to perform the pretreatment. Further, as the contact size is miniaturized, reduction of contact resistance is important, and thus sufficient cleaning is imperative. Under such background circumstances, etching must be performed sufficiently as the pretreatment.

A wet pretreatment method may be used as a cleaning method for the pretreatment. A solution of diluted hydrofluoric acid (HF:water=1:200) is used as chemical solution, and etching is performed in an amount sufficient to etch away a thickness of 3 nm of the thermal oxidation film. If there adheres a 1-nm-thick natural oxide film, the required etching amount will be 100 to 200% over the amount required for removing the natural oxide film. When using the solution of diluted hydrofluoric acid (HF:water=1:200), the required etching time is about two minutes. This etching amount also depends on the surface condition of the first memory cell plugs 12. In some cases, further cleaning by a greater amount of etching or cleaning with different type of chemical solution may become necessary.

The above-described cleaning step (pretreatment step) not only cleans the surface of the first memory cell plugs 12 but also etches away a part of the first interlayer film 28 and second interlayer film 29. This reduces the thickness of the second interlayer film 29. The first interlayer film 28 is etched down in the bit-line-contact forming groove 14. As a result, the level of the top surface of the first interlayer film 28 in the bit-line-contact forming groove 14 becomes lower than the level of the top surfaces of the first memory cell plugs 12. Specifically, a recessed portion is formed in the first interlayer film 28 around the first memory cell plugs 12, and hence the upper part of the first memory cell plugs 12 protrudes out of the surface of the first interlayer film surrounding the same. The top surface of the part of the first interlayer film 28 located within the bit-line-contact forming groove 14 becomes lower in level than the top surface of the region of the first interlayer film 28 where the bit-line-contact forming groove 14 is not formed (i.e. the boundary between the first interlayer film 28 and the second interlayer film 29) as viewed perpendicularly to the principal surface of the substrate 21.

It should be noted that the amount of the first interlayer film 28 etched away by this pretreatment is five to ten times greater in comparison with the case of a thermal oxidation film. In the case of a silicon oxide film, for example, about 20 nm of the film is etched away. This is not only because the structure is miniaturized but also because the etching resistance of the interlayer insulation film is deteriorated due to use of a low-temperature rapid thermal treatment such as RTP (Rapid Thermal Processing) (for example, ten minutes at 750° C.) for thermal treatment of the interlayer insulation film in order to reduce the thermal load to the transistors.

In the pretreatment, dry cleaning may be used as the cleaning method, in place of the wet pretreatment. In this case, HF gas is used. The dry cleaning is more advantageous than the wet pretreatment method in that it exhibits higher cleaning effect when cleaning minute holes or the like. Like the wet etching, the etching amount is set to a value corresponding to 100 to 200% over the amount required for removing the natural oxide film.

Next, an interconnection conducting film for forming interconnections is formed. In this example, a second conducting film and a third conducting film are used as the interconnection conducting film.

Firstly, in order to form a bit-line contact plug in each of the bit-line-contact forming grooves 14 cleaned as described above, a second conducting film 41 is formed as shown in FIGS. 4A and 4B. The bit-line-contact forming grooves 14 are thus filled with the second conducting film 41. The second conducting film 41 may be a layered film formed by sequentially depositing a Ti film, a TiN film, and a W film. The film formation may be carried out by using a CVD method. If there is no problem in terms of contact resistance, impurity doped silicon or the like may be used for the second conducting film 41.

Figure 5B:
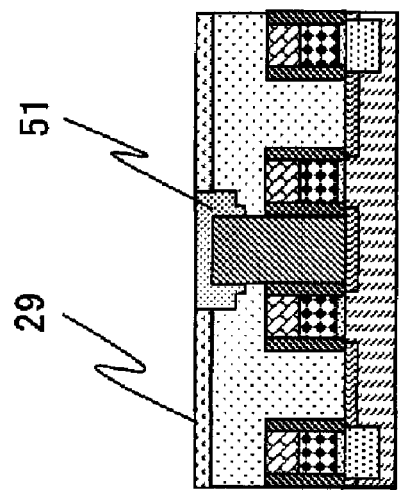
Figure 5A:
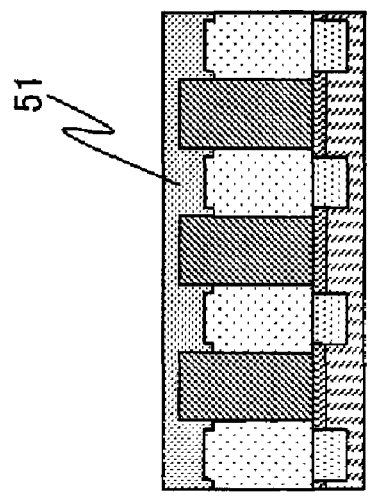

The second conducting film 41 is then polished by using a CMP method such that a portion of the second conducting film 41 buried in the bit-line-contact forming groove 14 is left unremoved. As a result, as shown in FIGS. 5A, 5B and 5C, a bit-line contact plug 51 buried in the bit-line-contact forming groove 14 is formed as a second contact plug. The top surface of the second interlayer film 29 is exposed.

Next, as shown in FIGS. 6A and 6B, a third conducting film 61 for forming the bit lines 16 serving as interconnections is formed, and a bit-line hard mask film 62 is formed on the third conducting film 61.

The third conducting film 61 can be formed, for example, by sequentially depositing a TiN film and a W film using a sputtering method. Alternatively, the third conducting film 61 may be formed by using a WSi film, a WSi polycide film (WSi/doped silicon), or the like. The bit-line hard mask film 62 may be formed of a silicon nitride film by using a plasma CVD method.

Figure 7B:
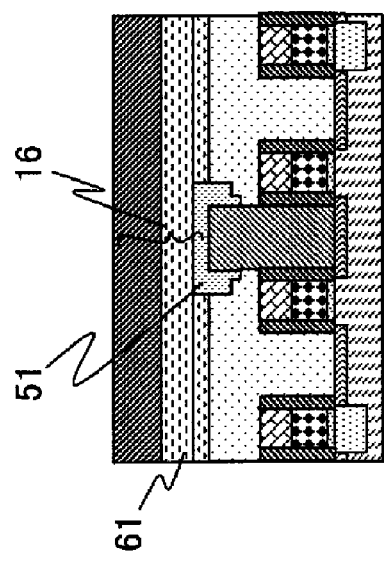
Figure 7A:
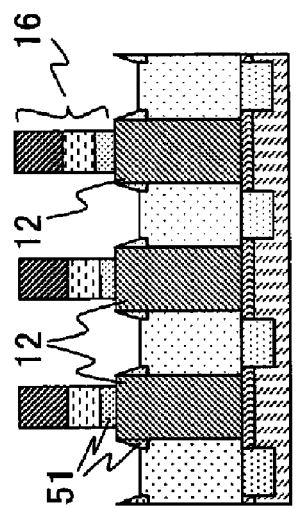

Next, a resist mask of a bit line pattern in which bit lines are arranged to pass over the first memory cell plugs 12 and to pass across the bit-line-contact forming grooves 14 is formed by using a photolithography technique. Using this mask, the bit-line hard mask film 62 and the third conducting film 61 are sequentially etched to expose the surface of the second interlayer film 29. Further, the bit-line contact plug 51 (the second conducting film 41) buried in the bit-line-contact forming groove 14 is etched to expose the surface of the first interlayer film 28 on the bottom of the bit-line-contact forming groove 14. The etching of the third conducting film 61 and the second conducting film 41 may be performed by using a gas containing $Cl_2$ or the like. As shown in FIGS. 7A, 7B and 7C, the bit-line contact plug 51 is patterned according to the pattern of the bit lines 16, and divided to correspond to the respective first memory cell plugs 12. Thus, a plurality of the first memory cell plugs 12 exposed in the same bit-line-contact forming groove 14 are electrically isolated from each other. As a result, the bit lines 16 are formed, each being formed of the third conducting film 61 and connected to the first memory cell plug 12 via the second conducting film 41 (i.e. the bit-line contact plug 51). In other words, the bit lines 16 provide a plurality of interconnections each of which is formed to pass across the opening and to be electrically connected to the top surfaces of the corresponding plurality of first memory cell plugs. The interconnections are each formed to extend from the recessed portion in the first insulation film, via the opening in the second insulation film, up to the top surface of the second insulation film.

According to this embodiment, as described above, bit-line contacts are provided by forming grooves each covering a plurality of first memory cell plugs, instead of forming holes in correspondence with respective first memory cell plugs. This makes it possible to increase the lithography margin.

If holes are formed as is conventionally done, it is desired to open the entire area of the top surface of the first memory cell plug in order to increase the contact area between the first memory cell plug and the bit-line contact plug. In this case, the distance between the holes is short, and hence the width of the resist pattern defining the distance between the holes becomes so small that the resist pattern may be caused to partially disappear by dry etching during formation of the holes and adjacent holes may be joined (short-circuited) to each other. According to this embodiment of the invention, in contrast, grooves are formed such that each groove covers a plurality of first memory cell plugs which are adjacent to each other and the bit-line contact plugs are buried in the grooves, so that the bit-line contact plugs are also etched when patterning the bit lines. Thus, according to this embodiment, the bit-line contacts are formed in a self-aligned manner, and hence the risk short circuit is eliminated.

Further, according to this first embodiment, a sufficient pretreatment is performed before depositing the second conducting film to form the bit-line contact plugs, so that contacts with low resistance can be formed. In addition, a recessed portion is formed in the first interlayer film by this pretreatment so that the first memory cell plugs project out. Accordingly, the contact area between the first memory cell plug and the bit-line contact plug can be increased, and contacts with low resistance can be provided.

As described above, the first embodiment of the invention enables formation of minute contacts.

A second embodiment of this invention will now be described.

As described above, in the semiconductor device according to the first embodiment, the first memory cell plugs 12 are configured to project out from the first interlayer film 28. The second conducting film 41 is deposited between these first memory cell plugs 12 and later removed by etching. As semiconductor devices are miniaturized further, the distance between the first memory cell plugs 12 will be decreased further. Then the over-etching amount must be increased in order to remove the deposited second conducting film 41. In particular, when the second conducting film 41 is formed by barrier metal films such as a TiN film, a Ti film, and a WN film, which have low etching rate, the over-etching rate will need to be further increased in order to remove the films completely without leaving residues. The increased over-etching amount will lead to increased thickness of the bit-line hard mask film 62, constituting an obstructive factor to miniaturization of the semiconductor device.

On the other hand, if the over-etching amount is not sufficient, residues 81 will be left between the first memory cell plugs 12, as shown in FIGS. 8A and 8B, possibly causing short-circuit.

Therefore, a semiconductor device according to the second embodiment employs a configuration which prevents formation of residues when etching away the second conducting film 41, and facilitates patterning of interconnections. Below, a method of manufacturing a semiconductor device according to the second embodiment will be described, while also describing a configuration thereof.

Like the first embodiment, the semiconductor device according to the second embodiment is a memory device having a configuration as shown in FIG. 1. The manufacturing steps of this memory device are the same as the first embodiment until the state shown in FIGS. 3A and 3B is attained.

After the bit-line-contact forming groove 14 has been formed as shown in FIGS. 3A and 3B, the first memory cell plugs 12 (first conducting film) are recess-etched as shown in FIGS. 9A and 9B. This etching is performed such that the top surfaces of the first memory cell plugs 12 are lower in level than the top surface of the first interlayer film 28 by about 50 nm at the bottom of the bit-line-contact forming groove 14 (the interface between the first interlayer film 28 and the second interlayer film 29), as viewed perpendicularly to the principal surface of the substrate 21. At the same time, the recess etching is performed such that the level of the top surfaces of the first memory cell plugs 12 does not become too low, and the top surfaces the first memory cell plugs are at a level 100 nm or more above the surface of the substrate. This is necessary because the substrate 21 might be etched by the subsequent etching for formation of the bit lines 16.

Next, as shown in FIGS. 10A and 10B, a second conducting film 41 is formed. In the same manner as in the first embodiment, a pretreatment (cleaning) is performed sufficiently prior to the formation of the second conducting film 41. This pretreatment reduces the thickness of the second interlayer film 29, and forms a recessed portion in the first interlayer film 28 within the bit-line-contact forming groove 14. The above-described recess etching process for lowering the level of the top surfaces of the first memory cell plugs is performed such that, in the state after the pretreatment, the level h2 of the top surfaces of the first memory cell plugs 12 is lower than the level h1 of the principal surface of the first interlayer film 28 located between the first memory cell plugs 12. For example, if the principal surface of the first interlayer film 28 is set back by the pretreatment by 20 to 30 nm, the top surfaces of the first memory cell plugs 12 can be made lower in level than the level of the principal surface of the first interlayer film 28 by 20 to 30 nm by recess-etching the top surfaces of the first memory cell plugs 12 by 50 nm.

After that, the same steps as in the first embodiment are performed.

Specifically, the second conducting film 41 is polished by a CMP method to expose the second interlayer film 29 and to form a bit-line contact plug 51 buried in the bit-line-contact forming groove 14 as shown in FIGS. 11A and 11B.

Then, as shown in FIGS. 12A and 12B, a third conducting film 61 and a bit-line hard mask film 62 to form bit lines 16 are sequentially formed.

Subsequently, using a resist mask of bit line pattern, the bit-line hard mask film 62, the third conducting film 61, and the bit-line contact plugs 51 are etched (patterned) to form bit lines 16 as shown in FIGS. 13A and 13B.

According to this second embodiment, the first memory cell plugs 12 are recessed with respect to the first interlayer film 28. Therefore, the area of the side walls of the first memory cell plugs 12 in contact with the second conducting film 41 (bit-line contact plug 51) is small. As a result, the second conducting film 41 is prevented from being left in a spacer-like form on the side walls of the first memory cell plugs 12 when patterning the bit-line contact plug 51. Thus, this second embodiment is able to provide a configuration having an enhanced effect of preventing the short circuit between the adjacent bit lines.

Further, according to the second embodiment, the second conducting film 41 formed in narrow gaps such as those between the first memory cell plugs 12 need not be removed, and hence the over-etching amount can be reduced. According to the second embodiment, therefore, the thickness of the bit-line hard mask film 62 can be reduced, and a configuration desirable for miniaturization of the semiconductor device can be obtained.

Although the second conducting film 41 may be left unremoved on the part in the recessed portion of the first memory cell plug 12 where no bit line is formed, it does not pose a problem.

Next, referring to FIGS. 14A and 14b through 19A to 19C, a semiconductor device according to a third embodiment of this invention will be described.

While in the first and second embodiments described above, the first interlayer film 28 exists also on the word lines 15, the first interlayer film 28 does not exist on the word lines 15 in this third embodiment.

More specifically, the manufacture of the semiconductor device according to the third embodiment is performed in the same manner as in the first embodiment until the step of depositing the first interlayer film 28.

After depositing the first interlayer film 28 on the word lines 15, the first interlayer film 28 is polished away until the top of the word lines 15, that is, the mask nitride film 25 is exposed. Employing a CMP method, the polishing can be performed while using the mask nitride film 25 located in the upper part of the word lines 15 as a stopper. Then, the first memory cell plugs 12 are formed in the same manner as in the first embodiment. As shown in FIGS. 14A and 14B, there are formed the mask nitride film 25 for forming the upper part of the word lines 15, the spacer nitride film 26, and the second interlayer film 29 in contact with the top surfaces of the first memory cell plugs 12.

Next, as shown in FIGS. 15A, 15B and 15C, the bit-line-contact forming groove 14 is opened in the second interlayer film 29. There are exposed, in the bit-line-contact forming groove 14, the top surfaces of the first memory cell plugs 12, the first interlayer film 28 surrounding the first memory cell plugs 12, the mask nitride film 25 and the spacer nitride film 26.

After that, the same steps as in the second embodiment are performed.

Figure 16A:
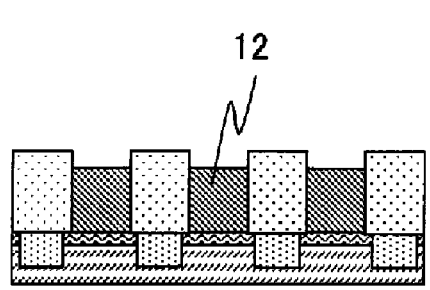
FIGS. 16A and 16B are diagrams for explain a recess etching step subsequent to the step shown in FIGS. 15A to 15C, FIG. 16A being a cross-sectional view taken along the line A-A' in FIG. 1, FIG. 16B being a cross-sectional view taken along the line B-B' in FIG. 1.
Figure 16B:
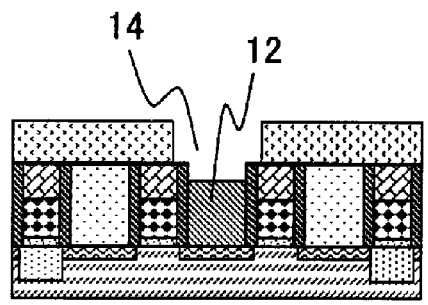

Specifically, the top surfaces of the first memory cell plugs 12 are recess-etched as shown in FIGS. 16A and 16B.

Figure 17A:
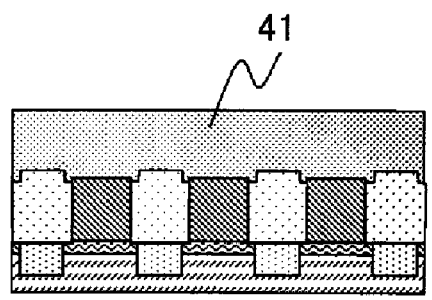
FIGS. 17A and 17B are diagrams for explaining a step of forming a second conducting film subsequent to the step shown in FIGS. 16A and 16B, FIG. 17A being a cross-sectional view taken along the line A-A' in FIG. 1, FIG. 17B being a cross-sectional view taken along the line B-B' in FIG. 1.
Figure 17B:
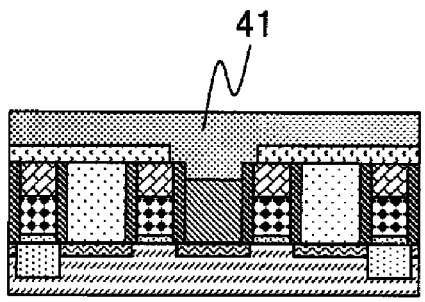

Then, the inside of the bit-line-contact forming groove 14 is cleaned by a pretreatment process, and a second conducting film 41 is formed to fill the bit-line-contact forming groove 14 as shown in FIGS. 17A and 17B.

Figure 18A:
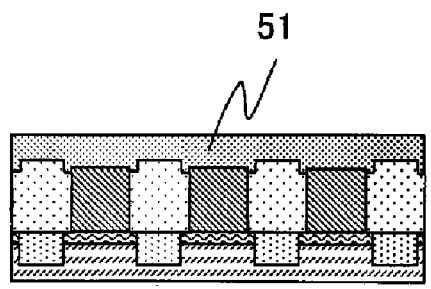
FIGS. 18A and 18B are diagrams for explaining a step of forming bit-line contact plugs subsequent to the step shown in FIGS. 17A and 17B, FIG. 18A being a cross-sectional view taken along the line A-A' in FIG. 1, FIG. 18B being a cross-sectional view taken along the line B-B' in FIG. 1.
Figure 18B:
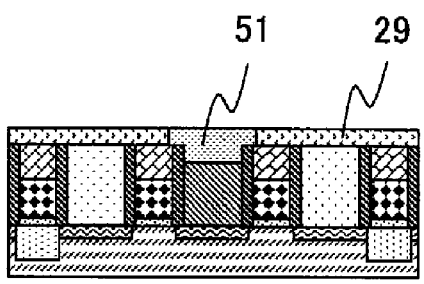

Subsequently, as shown in FIGS. 18A and 18B, the second conducting film 41 is polished to expose the second interlayer film 29, whereby a bit-line contact plug 51 is formed in the bit-line-contact forming groove 14.

Finally, as shown in FIGS. 19A and 19B, a third conducting film 61 and a bit-line hard mask film 62 are sequentially formed, and the formed films are patterned to form bit lines 16.

As described above, the semiconductor device according to the third embodiment is manufactured.

According to the third embodiment, the top surface of the first interlayer film 28 is made flush with the top surface of the mask nitride film 25 in the upper part of the word lines 15. Therefore, the uniformity in each chip can be improved in terms of thickness of the first interlayer film 28.

Further, according to this embodiment, the height of the first memory cell plugs 12 can be reduced, and thus the contact resistance can be reduced.

Next, referring to FIGS. 20A and 20B, and FIGS. 21A and 21B, a fourth embodiment of this invention will be described.

While description of the first to third embodiments has been made of a case in which the second conducting film and the third conducting film are used as an interconnection conducting film, this fourth embodiment uses only the second conducting film as the interconnection conducting film. This means that the second conducting film which is the material of the bit-line contact plugs is directly used to form interconnections.

A manufacturing method of the semiconductor device according to this embodiment is the same as any one of the first to third embodiments until the step of forming the second conducting film. The following description will be made of a case in which the method is the same as in the second embodiment.

After forming the second conducting film 41, that is, after the state shown in FIGS. 10A and 10B has been obtained, a bit-line hard mask film 62 is deposited as shown in FIGS. 20A and 20B.

Next, using a resist mask having a bit line pattern, the bit-line hard mask film 62 and the second conducting film 41 are patterned to form bit lines 16 as shown in FIG. 21A and FIG. 21B.

According to the fourth embodiment, as described above, the bit lines 16 can be formed without forming a third conducting film.

Thus, this fourth embodiment makes it possible to omit the step of forming the bit-line contact plug (the step shown in FIGS. 5A to 5C, FIGS. 11A and 11B, or FIGS. 18A and 18B) and the step of forming the third conducting film, providing advantages that the manufacturing steps can be simplified and the manufacturing cost can be reduced.

Next, a semiconductor device according to a fifth embodiment of this invention will be described.

Although the description of the first to fourth embodiments has been made of a case in which the semiconductor device is a memory device, this invention is applicable to semiconductor devices other than memory devices. The semiconductor device according to the fifth embodiment is assumed to be a common integrated circuit.

FIG. 22 is a plan view for explaining a schematic configuration of a semiconductor device according to the fifth embodiment, showing a state in which the step of forming interconnections has been finished.

The shown semiconductor device has an active region layer, a gate electrode layer, a first contact plug layer, a second contact forming groove layer, and a wiring layer, forming a plurality of (four, in this example) transistors Tr1 to Tr4 arranged in an array. In FIG. 22, these layers are represented as active regions 101, gate electrodes 102, first contact plugs 103, second contact forming grooves 104, and interconnections 105, respectively.

Second contact plugs (not shown) are formed on top of the first contact plugs 103. A second contact forming groove 104 is formed in an interlayer insulation film formed on the first contact plugs 103, the top surfaces of the first contact plugs 103 are exposed, and then the second contact plug is formed thereon. The interconnections 105 are electrically connected to the first contact plugs 103 via the second contact plug. Each of the interconnections 105 is formed to electrically connect a plurality of first contact plugs 103 arranged adjacent to each other in a transverse direction as viewed in the drawing.

The semiconductor device according to this fifth embodiment can be manufactured in the same manufacturing method of the semiconductor device according to the first to fourth embodiments. The gate electrodes 102, the first contact plugs 103, the second contact forming grooves 104, and the interconnections 105 in this fifth embodiment corresponding to the word lines 15, the memory cell plugs 12, the bit-line-contact forming grooves 14, and the bit lines 16, respectively.

According to this embodiment, the second contact forming grooves 104 each covering a plurality of (four, in this example) first contact plug are provided instead of providing holes in correspondence with the respective first contact plugs 103. Accordingly, even if the first contact plugs 103 are integrated or arranged at a high density, the lithography process to be performed on the second contact plugs can be performed easily.

Thus, the application of this invention it not limited to memory devices, but the invention is widely applicable to semiconductor devices having a configuration in which an insulation film is formed on contact plugs and interconnections are formed to be connected to the top surfaces of the contact plugs.

Although this invention has been described in conjunction with a several preferred embodiments thereof, this invention is not limited to the foregoing embodiments but may be modified in various other manners within the scope of the appended claims. For example, an insulation film made of a material other than those mentioned above may be used as the first and second interlayer films. Likewise, a conducting film made of a material other than those mentioned above may be used as the first, second and third conducting films. In this case, a barrier metal may be used if appropriate. Further, the number of contact plugs exposed in each contact forming groove is at least two or more. In this case, the contact forming grooves can be formed such that each contact forming groove corresponds to each row of contact plugs arranged along a predetermined direction.

What is claimed is:

1. A semiconductor device comprising:
a first interlayer film defining a plurality of contact holes arranged along a first direction;
a plurality of contact plugs filled in the contact holes, respectively;
a second interlayer film formed on the first interlayer film and having an opening to expose a predetermined region of the first interlayer film including a region where the contact plugs are disposed; and
a plurality of interconnections formed to extend across the opening and to be in contact with top surfaces of the contact plugs, respectively, wherein each interconnection extends in a second direction being crossed to the first direction,
wherein the top surfaces of the contact plugs are lower in level than an interface between the first interlayer film and the second interlayer film.

2. The semiconductor device as claimed in claim 1, wherein the first interlayer film includes a portion which is recessed from a surface of the first interlayer film within the opening.

3. The semiconductor device as claimed in claim 1, wherein the first interlayer film is disposed on a semiconductor substrate; and
the semiconductor device further comprises:
a recessed portion formed in the region of the first insulation film exposed by the opening, the recessed portion including a top surface which is lower than a level of a top surface of a region of the first insulation film where the opening is not formed.

4. The semiconductor device as claimed in claim 3, wherein the top surface of the recessed portion in the first insulation film includes a part which is higher in level than the top surfaces of the contact plugs.

5. The semiconductor device as claimed in claim 3, wherein the interconnections are formed to extend from the recessed portion in the first insulation film via the opening in the second insulation film up to a top surface of the second insulation film such that the interconnections pass across the opening and are connected to the top surfaces of the respective contact plugs.

6. The semiconductor device as claimed in claim 3, comprising a plurality of sets of the contact plugs, the opening being formed in correspondence with each set thereof.

7. The semiconductor device as claimed in claim 6, wherein each of the interconnections is connected to the top surfaces of the contact plugs belonging to different sets.

8. The semiconductor device as claimed in claim 3, further comprising a wiring line disposed on the semiconductor substrate, wherein the top surfaces of the contact plugs are lower in level than a top surface of the wiring line.

9. A semiconductor device comprising;
a first interlayer film having a plurality contact holes arranged in line in a first direction;
a plurality of first contact plugs filling the contact holes, respectively;
a second interlayer film formed over the first interlayer film and the contact plugs, the second interlayer film having an opening which continuously exposes the first contact plugs and respective parts of the first interlayer film around the first contact plugs;
a plurality of interconnections each extending in a second direction, which crosses the first direction, to intersect the opening of the second interlayer film with overlapping an associated one of the first contact plugs; and
a plurality of second contact plugs each intervening between an associated one of the first contact plug and a portion of an associated one of the interconnections,
wherein the top surface of the first contact plugs are lower in level than a top surface of the first interlayer film of a region without the opening of the second interlayer.

10. The semiconductor device as claimed in claim 9, wherein the first interlayer film is disposed over a semiconductor substrate; and
the semiconductor device further comprises;
a recessed portion in the first interlayer film having a region same as the opening of the second interlayer.

11. The semiconductor device as claimed in claim 10, wherein the second contact plugs cover a part of the recessed portion in the first interlayer film and a part of the top surface of the second contact plugs and a part of a side face of the second interlayer at a pattern edge of the opening.

12. The semiconductor device as claimed in claim 10, comprising a plurality of a set of the first contact plugs each including an associated one of the opening of the second interlayer.

13. The semiconductor device as claimed in claim 12, comprising a plurality of a set of the second contact plugs each connecting an associated one of set of the first contact plugs within the opening of the second interlayer.

14. The semiconductor device as claimed in claim 13, wherein a plurality of interconnections each connects an associated one of the second contact plugs belonging to different sets.

15. The semiconductor device as claimed in claim 10, further comprising a wiring line disposed over the semiconductor substrate, wherein the top surface of the contact plugs are lower in level than a top surface of the wiring line.

16. The semiconductor device as claimed in claim 9, wherein the recessed portion has a stepped bottom surface in the first interlayer film, a part of the bottom surface is higher in level than the top surface of the first contact plugs.

17. A semiconductor device comprising:
a plurality of conductive regions formed apart from each other and disposed in line in a first direction;
an interlayer insulating layer covering the conductive regions and including an opening that exposes at least a part of each of the conductive regions; and
a plurality of interconnections each extending in a second direction, that is substantially perpendicular to the first direction, to cross an associated one of the conductive regions, each of the interconnections including a projection that is in contact with the associated one of the conductive regions, the projection of each of the interconnections being defined in the first direction by a width of an associated one of the interconnections and in the second direction by a width of the opening.

18. The device as claimed in claim 17, wherein the projection of each of the interconnection comprises a conductive plug formed in the opening of the interlayer insulating layer.

* * * * *